US012417398B2

United States Patent
Moseley, Jr. et al.

(10) Patent No.: US 12,417,398 B2
(45) Date of Patent: Sep. 16, 2025

(54) INTERFACE BETWEEN CRYOGENIC COMPUTATIONAL HARDWARE AND ROOM TEMPERATURE COMPUTATIONAL HARDWARE

(71) Applicant: Quantum Circuits, Inc., New Haven, CT (US)

(72) Inventors: Samuel H. Moseley, Jr., New Haven, CT (US); Pratheev Sabaratnam Sreetharan, Concord, MA (US); Robert John Schoelkopf, III, Madison, CT (US)

(73) Assignee: Quantum Circuits, Inc., New Haven, CT (US)

( * ) Notice: Subject to any disclaimer, the term of this patent is extended or adjusted under 35 U.S.C. 154(b) by 246 days.

(21) Appl. No.: 17/966,424

(22) Filed: Oct. 14, 2022

(65) Prior Publication Data
US 2023/0409944 A1    Dec. 21, 2023

Related U.S. Application Data

(60) Provisional application No. 63/255,917, filed on Oct. 14, 2021.

(51) Int. Cl.
*G06N 10/40* (2022.01)
*H01P 1/22* (2006.01)
(Continued)

(52) U.S. Cl.
CPC .............. *G06N 10/40* (2022.01); *H01P 1/30* (2013.01); *H01P 3/081* (2013.01); *H04B 10/70* (2013.01); *H01P 1/227* (2013.01)

(58) Field of Classification Search
CPC ... G06N 10/40; H01P 1/02; H01P 1/30; H01P 1/227; H01P 3/30; H04B 10/70
(Continued)

(56) References Cited

U.S. PATENT DOCUMENTS 4,739,633 A * 4/1988 Faris ................... H03K 19/195
                                                              62/51.1
2010/0157552 A1  6/2010 Thom et al.
(Continued)

OTHER PUBLICATIONS

International Searching Authority/EP, International Search Report and Written Opinion of the International Searching Authority, Application No. PCT/2022/046744, dated Jan. 31, 2023, 13 pages.
(Continued)

*Primary Examiner* — Andrea Lindgren Baltzell
*Assistant Examiner* — Abigail Amir Yaldo
(74) *Attorney, Agent, or Firm* — Sunstein LLP

(57) ABSTRACT

An interface between cryogenic computational hardware and room temperature computational hardware includes a plurality of discrete stages, including a first stage at room temperature and a last stage at a cryogenic temperature. Each successive stage is configured for operation at a corresponding refrigeration temperature that is lower than the refrigeration temperature of each preceding stage and includes a set of planar transmission lines. The transmission lines of any given stage other than the first stage are proximally coupled to and contiguous with the transmission lines of an immediately preceding stage. The transmission lines of the first stage are proximally coupled to the room temperature computational hardware, and the transmission lines of the last stage are proximally coupled to the cryogenic computational hardware. Each stage has shielding configured to block electromagnetic radiation external to such stage.

12 Claims, 4 Drawing Sheets

(51) Int. Cl.
 *H01P 1/30* (2006.01)
 *H01P 3/08* (2006.01)
 *H04B 10/70* (2013.01)

(58) Field of Classification Search
 USPC .......................................................... 333/168
 See application file for complete search history.

(56) References Cited

U.S. PATENT DOCUMENTS

| | | |
|---|---|---|
| 2018/0069288 A1 | 3/2018 | Minev et al. |
| 2021/0028346 A1 | 1/2021 | Martinis |
| 2021/0066570 A1 | 3/2021 | Luethi et al. |
| 2021/0111470 A1 | 4/2021 | El Bouayadi et al. |

OTHER PUBLICATIONS

Deshpande et al., "Integrating High-Density Microwave Signalling and Packaging With Superconducting Qubits," 2019 IEEE MTT-S International Microwave Symposium (IMS), IEEE, Jun. 2, 2016, pp. 271-274, XP033579692.

* cited by examiner

INTERFACE BETWEEN CRYOGENIC COMPUTATIONAL HARDWARE AND ROOM TEMPERATURE COMPUTATIONAL HARDWARE

RELATED APPLICATION

The present application claims the benefit of Provisional Application Ser. No. 63/255,917, filed Oct. 14, 2021, which is hereby incorporated herein by reference in its entirety.

TECHNICAL FIELD

The present invention relates to an interface between cryogenic computational hardware and room temperature computational hardware, and more particularly to an interface between cryogenic computation hardware and room temperature computational hardware including planar transmission lines.

BACKGROUND ART

In a quantum computer based on superconducting qubits, quantum information is carried by single microwave photons. High fidelity quantum operations require the states of these photons to be long-lived (typically longer than 100 microseconds). For such quantum states to have the long lives required for high fidelity computation, there must be no interfering environmental photons that can change the state of the system. This can be achieved in principle by cooling the qubits to sufficiently low temperatures (typically about 0.02 K) in a sealed environment. However, to execute quantum operations essential for quantum computing, the quantum information must be controlled and measured. This is done using microwave signals transmitted to and from room temperature electronics.

An interface is the structure used to transport signals between room temperature electronics and cryogenic quantum hardware. The interface may also implement interconnects between discrete units of cryogenic quantum hardware. A basic and challenging engineering problem in the operation of superconducting qubits is to implement this interface without adding spurious signals or thermal photons from the surrounding warm (up to room temperature, about 300 K) environment, a feat that requires careful attenuation and spectral filtering.

SUMMARY OF THE EMBODIMENTS

In accordance with one embodiment of the invention, an interface between cryogenic computational hardware and room temperature computational hardware includes a plurality of discrete stages, including a first stage at room temperature and a last stage at a cryogenic temperature. Each successive stage is configured for operation at a corresponding refrigeration temperature that is lower than the refrigeration temperature of each preceding stage and includes a set of planar transmission lines. The transmission lines of any given stage other than the first stage are proximally coupled to and contiguous with the transmission lines of an immediately preceding stage. The transmission lines of the first stage are proximally coupled to the room temperature computational hardware, and the transmission lines of the last stage are proximally coupled to the cryogenic computational hardware. Each stage has shielding configured to block electromagnetic radiation external to such stage.

Alternatively or in addition, stages after the first stage are evacuated. Also alternatively or in addition, the transmission lines of any stage other than the first stage are disposed in a polymeric block defining a feedthrough region between stages so as to maintain evacuation of the stages.

Alternatively or in addition, the transmission lines of any stage other than the first stage are shielded from electromagnetic radiation. Optionally, the transmission lines of any stage other than the first stage are implemented as a stripline passing a narrow aperture of a barrier between adjacent stages and through a conductive shielding cap configured to cover the entirety of the aperture.

Further alternatively or in addition, the transmission lines between at least one pair of adjacent stages are made of a material selected from the group consisting of stainless steel, copper-nickel alloys, nickel-chromium, brass, and combinations thereof. Alternatively or in addition, the transmission lines between at least one pair of adjacent stages are made of a superconducting material, selected from the group consisting of aluminum, zinc, titanium, and combinations thereof, configured to provide ultra low loss signal transport capability at temperatures below a critical temperature of the superconducting material.

Also alternatively or in addition, the transmission lines between at least one pair of adjacent stages are configured to provide desired filtering of a type selected between band-pass and low-pass. Further alternatively or in addition, the transmission lines between at least one pair of adjacent stages are configured to implement a microwave process selected from the group consisting of combining, splitting, multiplexing, and combinations thereof.

Alternatively or in addition, the transmission lines between at least one pair of adjacent stages are configured to provide desired microwave attenuation. Also alternatively or in addition, the transmission lines between at least one pair of adjacent stages are configured to provide desired thermal conductivity. Further alternatively or in addition, the transmission lines from a last stage terminate in an antenna structure configured as a qubit launcher. In another related embodiment, a set of the transmission lines at the last stage is configured as thin Ti microstrips, in each case deposited on a copper ground plane, and operating in a milli K temperature range, so as to provide low pass transmission line filtering.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Figure 1:
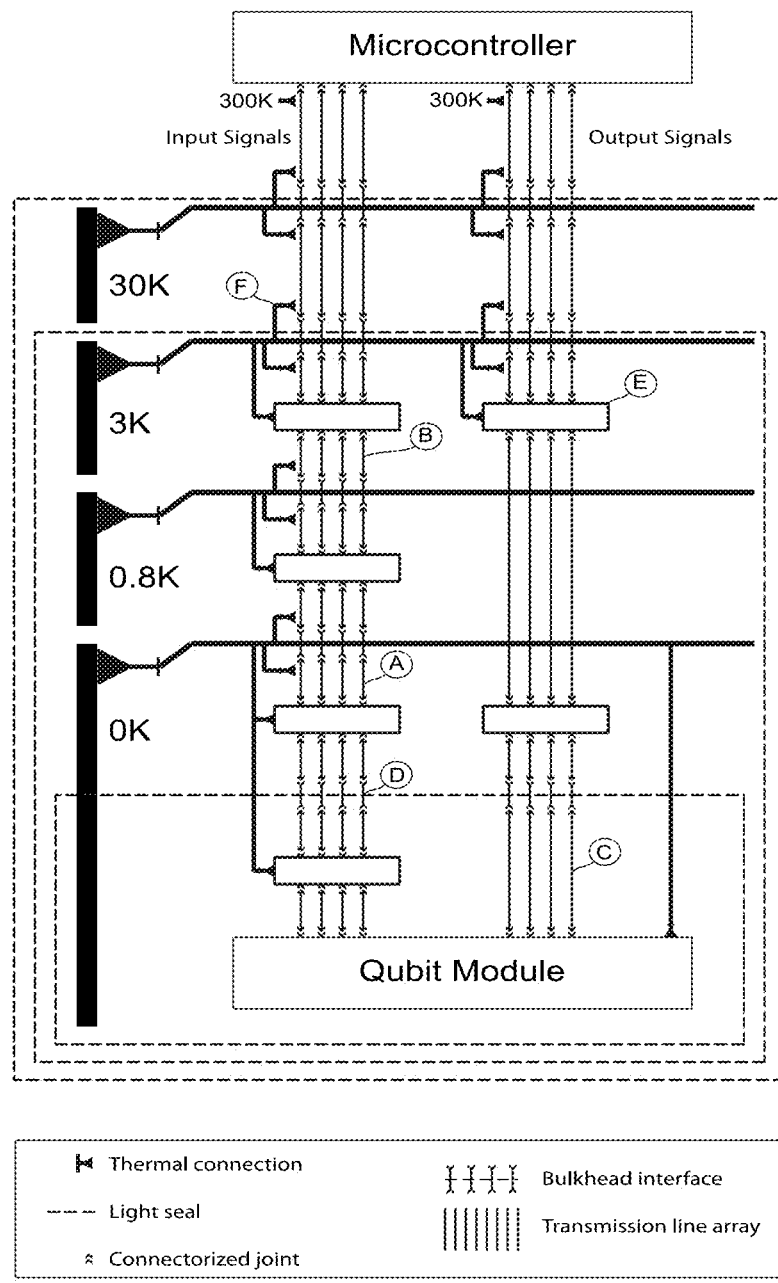
FIG. 1 shows a typical configuration of a conventional cable system for a cryogenic quantum computing system.

Definitions. As used in this description and the accompanying claims, the following terms shall have the meanings indicated, unless the context otherwise requires:

A "set" includes at least one member.

A "planar transmission line" is a flexible conductor having a composition suitable for desired operation of the conductor at the conductor's ambient temperature.

"External light" and "external electromagnetic radiation," in the context of an interface between cryogenic computational hardware and room temperature computational hardware, includes electromagnetic radiation generated from stages within the interface as well as from the room temperature environment external to the interface.

Here we present an integrated flex interface solution that greatly improves the qubit environment, provides it in a predictable and calculable way, and reduces total system complexity and cost as compared to a conventional interface.

Detailed Requirements

Interfacing control and readout signals for superconducting quantum computation systems have the following performance requirements:

(1) The interface should transport signals effectively over the bandwidth of the microwave control and measurement signals (typically 2-10 GHz) with good impedance matching, while preserving the spectral content and pulse shapes of control signals. The signal transport must suppress any crosstalk, in which one signal path couples to another. Readout lines must provide quantum-limited sensitivity to measure the quantum state of the system and must not allow the input of interfering photons into the quantum system.

(2) The interface must transmit signals through several thermal interfaces spanning the range from room temperature (~300 K) to the 0.02 K operating environment for the qubit. The interface must be in strong thermal contact at each thermal stage to allow the temperature distribution within the interface to be prescribed. The thermal conductances of the signal interface between successive thermal stages must be designed to be consistent with the cooling capabilities of the refrigeration system. At temperatures below ~3 K, superconducting elements are required to achieve sufficiently low loss and high-fidelity connectivity among the quantum elements.

(3) The interface must provide low occupation of thermal photons at the 0.02 K output. Thermal emission from the warmer parts of the system must be attenuated to provide adequately low photon occupation numbers. Temperature rise of the interface structure due to dissipation of drive signals must be limited by design and fabrication processes to provide the required low photon occupation numbers.

(4) Signal lines may require spectral filtering to limit interfering photons.

(5) Frequency-domain multiplexing and demultiplexing may be required to limit the number of signal lines as the scale and complexity of the systems increase.

(6) Transitions through thermal interfaces should provide light-tight seals to limit interfering photons in free space.

(7) Materials used in the interface must be chosen to meet ancillary engineering requirements: Outgassing rates of the cabling should be consistent with the requirements of the cryogenic system; materials inside the magnetically shielded qubit volume must be nonmagnetic.

(8) The interface structure should be compact and low-profile, allowing scaling to many thousands of connections, allowing easy routing within the system, and allowing for "ganged" or multi-way connections to speed assembly and improve reliability.

(9) The interface system should have an integrated vacuum feedthrough.

The Conventional Solution

FIG. 1 shows a typical configuration of a conventional cable system for a cryogenic quantum computing system. The system requires many interconnections between microwave elements, most of which are not designed for strong internal thermal conductivity A typical interface for transporting room temperature microwave signals to and from a cryostat containing quantum hardware has the following features:

(1) Vacuum feedthroughs: discrete components for each signal to cross the vacuum threshold.

(2) General signal transport: Coaxial cables, usually constructed with copper conductors, each used to transport a single signal with limited loss from two endpoints at similar temperatures (A in FIG. 1).

(3) Signal transport across thermal gradients: coaxial cables using materials with high thermal resistance (e.g. stainless steel) to transport individual signals without transporting heat (B in FIG. 1).

(4) Low loss signal transport: Superconducting coaxial cables, each used to transport a single signal with ultra-low loss at low temperatures (C in FIG. 1). Usually used for low power output signals and interconnects between discrete units of cryogenic quantum hardware.

(5) Shielding feedthroughs: discrete components for each signal to traverse light sealing interfaces (D in FIG. 1).

(6) Microwave filters: Packaged and connectorized commercial microwave components for altering spectral content of signals, part of a microwave network (E in FIG. 1).

(7) Microwave combiners/splitters/multiplexers: Packaged and connectorized commercial microwave components to enable multiple signals to be transported on a single piece of hardware, part of a microwave network (E in FIG. 1).

(8) Microwave attenuators: Packaged and connectorized commercial microwave components that intentionally dissipate power from a signal in a controlled manner.

(9) Heat sinking: Bundles of copper braid, with each braid mounted to an individual component to transport heat to a thermal anchor (F in FIG. 1).

(10) Qubit launchers: Discrete components implementing a transition between conventional cabling and cryogenic quantum hardware, accepting a coaxial cable carrying a signal and launching the signal into and out of a quantum module.

Such a configuration has enabled the demonstration of the first generation of quantum computers, but a more scalable solution providing higher performance in the quantum environment is essential for the next generation of much larger and higher fidelity machines.

Challenges with the Conventional Solution

The difficulty of interfacing between cryogenic quantum hardware and room temperature digital systems is a primary impediment to the creation of more capable superconducting quantum computers. Key challenges of conventional interfacing include 1) poor scalability over capability, volume, cost, and install time, 2) poor reliability, 3) poor RF performance, 4) poor achievable quantum lifetimes, and 5) poor thermal predictability.

1) Poor Scalability. Conventional interfaces to qubits do not scale well to the larger signal and qubit counts required to increase quantum computing capability. Individual conventional coaxial cables for cryogenic environments are bulky, stiff, and unwieldy, with achievable density often limited by connector size, tool access, and the need to sequentially assemble all cables. Conventional microwave components are often packaged individually or in small numbers, with connectorized input and output interfaces, requiring substantial volume. Cables traverse sealing interfaces for magnetic-tight and light-tight volumes individually, requiring bulky discrete hardware. These features in concert cause costly and limited cryogenic volumes to be quickly filled by even simple cryogenic hardware configurations, greatly limiting scalability to more complex and capable cryogenic systems.

2) Poor Reliability. Every cable in a conventional quantum interface typically uses a connector on each end. Each discrete microwave component added to a single cable path typically adds two more connectors. Each traversal through a bulkhead, vacuum seal, magnetic seal, or light seal interface adds two or four more connectors. Transporting a typical signal from room temperature down to OK using a conventional interface can involve twenty or more connectors and as many separate commercial components. Every individual connector and component is a separate point of failure. Scaling to just one hundred signals introduces two thousand or more points of failure, and the associated reduction in system reliability severely limits development of more highly capable quantum computers requiring higher signal counts.

3) Poor RF Performance. Noise, interference, and poor microwave performance are endemic to signal paths implemented via conventional interface strategies. Interfaces often rely on commercial microwave components that are not optimized for operation in extreme cryogenic environments and are often performance limited by self-heating from control signals. At low photon occupations, noisy self-emission from even scant microwave loss in unoptimized microwave components can dominate qubit signals of interest. Conventional coaxial cables, filters and attenuators provide little protection against transmission of photons in the 100 GHz range and above, allowing noise to be transported efficiently along the signal paths themselves into and out of the qubits. In addition, the loss due to connectors greatly limits the overall performance of even nominally low loss superconducting cables. Under a conventional interface implementation, these noise, interference, and performance issues worsen with increasing component count, a significant obstacle to increasing the capability of quantum computers.

4) Poor Quantum Lifetime. Strict control of the thermal environment leads to longer quantum state lifetimes within qubits, which in turn lead to higher quantum computational performance. Thermal photons result from blackbody radiation by any materials above millikelvin temperatures. The quantity of individual connectors, joints, and feedthroughs in a conventional interface allow many opportunities for thermal photons to infiltrate from higher temperature stages into qubits. Degrading thermal photon isolation with increased complexity limits capability of quantum computers using a conventional interface.

5) Poor Thermal Predictability. Stability and predictability of interface properties are critical to operating near performance bounds of cryogenic quantum processing systems, requiring prescribed temperatures at interfaces and inside the component elements across all operating conditions. A conventional system has numerous components often provided as "black boxes" by commercial manufacturers and the internal thermal circuits and materials in the devices are not known. In addition, there are many thermal connections to cables and components. Conventional interfaces often unavoidably have elements with poorly defined, unpredictable, or operation-sensitive temperatures, restricting the performance of cryogenic quantum hardware.

The Integrated Flex Solution

We disclose embodiments of an integrated flex interface, a novel technology addressing all key challenges imposed by conventional interfaces that impede development of more capable and complex quantum computers. We expand on commercial multilayer flex circuit techniques to incorporate new materials and processes allowing conventional microwave components to be integrated into the substrate. We implement organized thermal transport within the substrate, increasing thermal predictability. We create methods for unbroken flex ribbons containing many signals to traverse light-sealing and magnetic-sealing barriers with low leakage. We disclose methods to transition between a flex substrate and conventional coaxial cable, flex and a sapphire, Si, Si/Ge, or other low loss crystalline dielectric wafer, and flex and qubit elements including high Q resonators and transmons. In concert, these advances enable an integrated flex interface, whereby all microwave elements and signal conditioning elements required for a scalable interface are integrated into a multilayer flex structure (C in FIG. 2).

Multilayer flex circuits are widely used for general electronics applications. A typical multilayer circuit entails layers of dielectric film (usually polyimide film) bonded with layers of conductive metal (usually copper). The conductive layers are photo-etched to create circuitry, and a multitude of mature commercial processes exist to create inter-layer connections, attachment points for discrete components and connectors, and protective coverlay films.

For the application of interfacing to cryogenic quantum hardware, we introduce other materials and processes to expand capability. The added materials include resistive metals (e.g. CuNi or NiCr) and superconducting metals (e.g. Al, Ti, Zn, NbTi), while the added processes include evaporative plating and wire bonding. These added materials and processes enable a diverse array of microwave and signal conditioning elements to be integrated into the flex layup.

Planar transmission lines such as copper stripline, microstrip, and coplanar waveguide structures provide for general signal transport across the full range of temperatures. Similar structures implemented in superconducting metals realize low loss signal transport at low temperature. Resistive metal structures create precise attenuation. A range of more complex patterned metal structures function as microwave filters, multiplexers, quadrature hybrids, and other microwave components. Components that cannot yet be integrated directly into the flex layup can be attached to the surface as discrete modules through standard soldering and pick-and-place techniques.

Figure 2:
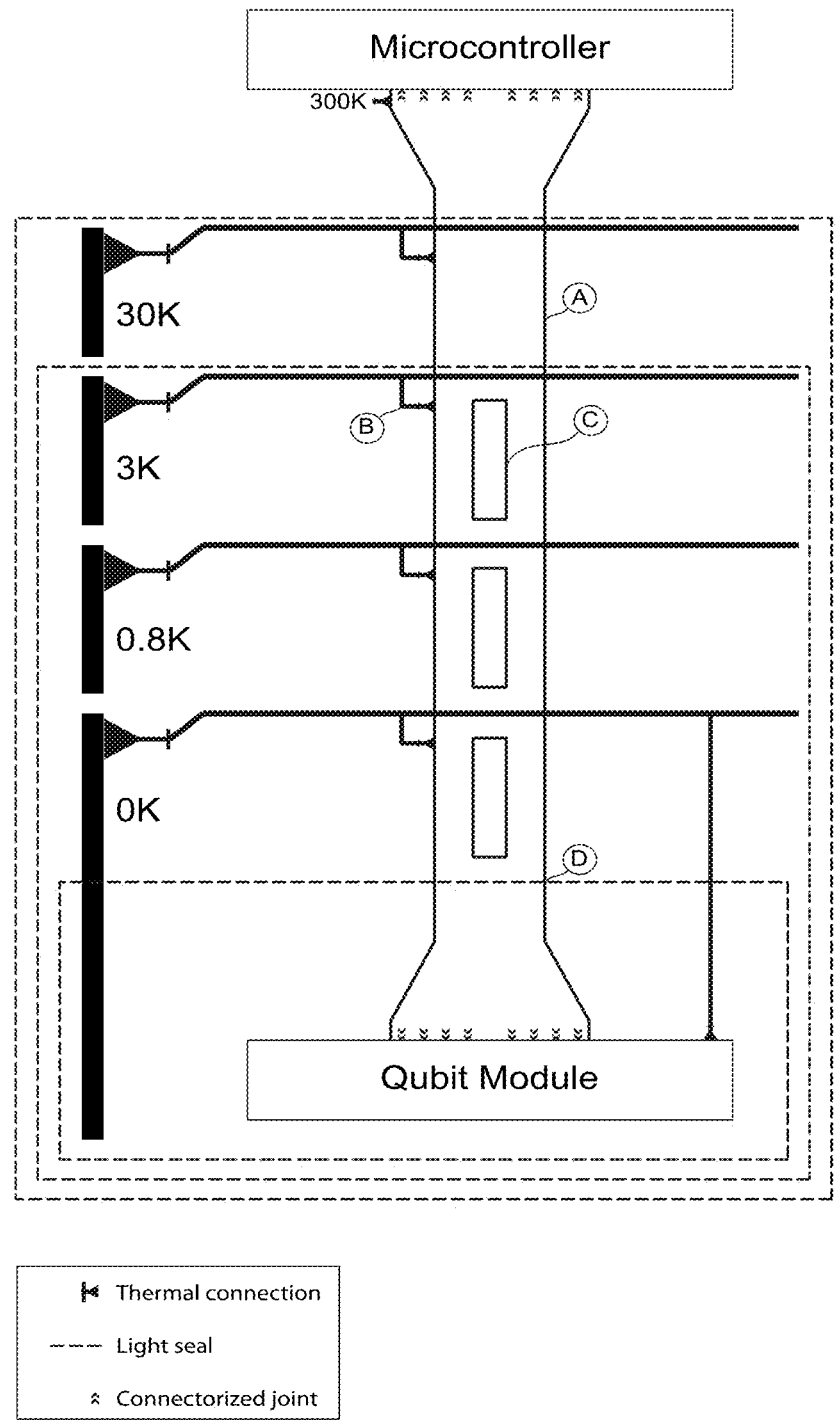
FIG. 2 shows an integrated flex interface in accordance with an embodiment of the present invention.

FIG. 2 shows an integrated flex interface in accordance with an embodiment of the present invention. The system has no external connections except those at 300K for connection to control electronics. The base temperature end of the line provides a custom interconnect to the quantum hardware.

Copper layers provide excellent heat transport capability, and the thin layered topology leads to large efficient contact area between copper and heat sources within or on the flex structure. A copper heat transport layer can contact many microwave component heat sources, transporting all heat predictably to engineered attachment points to refrigeration (B in FIG. 2).

Figure 3:
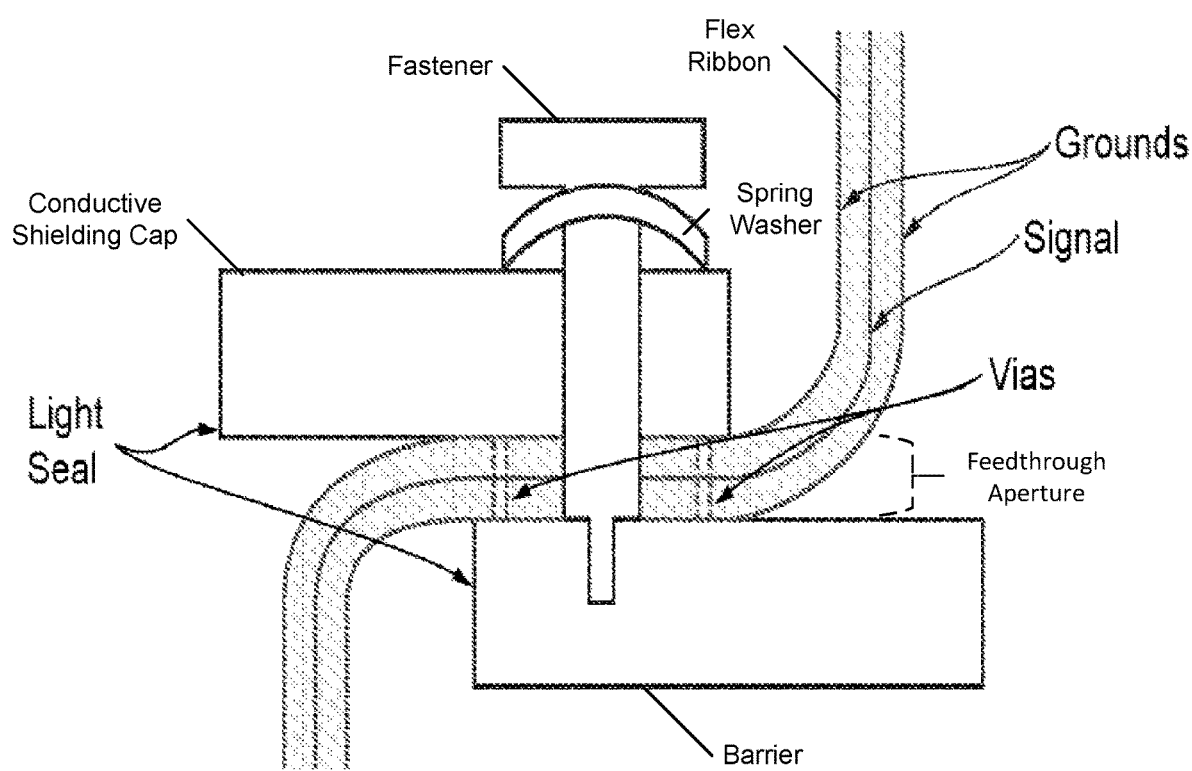
FIG. 3 shows a light seal achieved by the distributed flex interface in accordance with an embodiment of the present invention.

Signal transport lines within the flex can be packed tightly into a thin ribbon (A in FIG. 2). Traversing light sealing interfaces with such a ribbon is simply and effectively done, especially in contrast with a conventional implementation sealing each signal individually. See (D in FIG. 2, detail in FIG. 3) for a specific implementation of a light sealing interface with a flex ribbon. FIG. 3 shows that a high quality light seal is provided where the cable transitions from a warmer to colder environment to avoid transmission of free space photons. Metal to metal connection between the cable ground and the clamps provides high quality light seal that can easily be removed as required. Alternatively, the ground planes can be soldered into a copper interface plate to provide light tightness. This is more permanent, but provides a seal of similarly high quality A flex ribbon can be separated at one or both ends into individual and/or groups of signals, a topology generally called a wiring harness. A harness topology enables flex to transport integrated groups of signals which then break out into a complex geometry to conform to the attachment needs of cryogenic quantum hardware. Such a wiring harness also implements interconnects between quantum hardware units, scalable over signal count, cost, volume, and assembly time.

The integrated flex interface also supports efficient transitions to other technologies. Commercial connectors enable transition between flex and conventional coax or circuit boards. Engineered flex launchers enable direct interfacing with quantum cavities, resonators, and other elements. Wirebonding enables transition to elements constructed from non-flex substrates, such as silicon or sapphire.

Features of the Integrated Flex Interface

The integrated flex interface can be a monolithic solution, whereby a single flex ribbon travels from room temperature electronics to cryogenic quantum hardware. Alternately, the interface can be separated into a small number of ribbons connected to each other, or interconnecting discrete cryogenic quantum hardware units, as specific demands dictate. The integrated flex interface implements all features of conventional interfaces in a simplified, high performance, integrated fashion:

(1) Vacuum feedthroughs: a flex ribbon containing many signals is potted with a molded polymer (e.g. epoxy) into a standard cross section suitable for use with a removable O-ring interface. In a specific embodiment, a feedthrough region of the flex interface is a narrow thin ribbon containing one or more signal transport structures. This feedthrough region is cast into an epoxy block whose surface is molded in the form of a K-F flange. The molded surface is mated to the O-ring and clamped to the K-F vacuum connector providing a vacuum seal penetrated by the flex ribbon.

(2) General signal transport: Copper transmission line structures (e.g. microstrip, stripline, coplanar waveguide) implements general signal transport on an integrated flex interface. These structures transport many signals on a flex ribbon with limited loss from two endpoints at similar temperatures. High density copper transmission lines are an established technology on flex substrates.

(3) Thermally insulated signal transport: Introducing unconventional thermally resistive materials (e.g. stainless steel, copper-nickel alloys, nickel-chromium, brass, others) into transmission line topologies realizes these novel signal transport structures within a flex ribbon. These thermally insulated structures on an integrated flex interface enable signal transport, at high signal density, between components, structures, and flex interface regions that are at different temperatures.

(4) Low loss signal transport: Introducing unconventional superconducting materials (e.g. aluminum, zinc, titanium, others) into transmission line topologies realizes ultra low loss signal transport capability at temperatures below the critical temperature of the superconductor. These novel superconducting transmission lines enable an integrated flex interface to support high fidelity transport of ultra-low power signals, at high signal density, to, from, and between cryogenic quantum hardware elements.

(5) Shielding feedthroughs: A continuous flex ribbon carrying many signals can traverse a light sealing barrier with ultra-low leakage. To accomplish this, in the vicinity of the barrier, signals use a transmission line topology with grounded metal on outer flex surfaces, e.g. stripline. The flex ribbon passes through a narrow aperture in the barrier. One grounded metal outer flex surface is exposed and makes electrical contact with the perimeter of the aperture. A conductive shielding cap is clamped down over the flex ribbon and covers the entirety of the aperture. The other grounded metal outer flex surface is also exposed around the perimeter of the aperture and makes electrical contact with the shielding cap. Electrical contact can be accomplished by wet conventional soldering, by use of a soft metal as a compressive seal (e.g. indium wire), or by passivating the exposed outer flex surfaces and applying a distributed force to the shielding cap to ensure intimate mechanical and electrical contact between the flex and both barrier and shielding cap. This latter topology creates a feedthrough that is non-destructively disassembled; an implementation relying on spring washers to create the distributed force is illustrated in FIG. 3. With this design, the only available mode of ingress for light is the small gap between the barrier and cap that exists around the perimeter of the aperture. This gap is filled by the thickness of the flex ribbon, and is effectively sealed by closely spaced vias connecting the grounded metal outer flex surfaces across the flex thickness. This method constitutes a shielding feedthrough for a flex ribbon, enabling many signals to simply and effectively traverse light sealing barriers.

(6) Microwave filters; Planar filter structures implemented on a flex ribbon can realize a wide variety of microwave filters. Embodiments of such microwave filters include band pass filters and low-pass stub filters, implemented in an appropriate material (e.g. aluminum or copper) depending on loss requirements. Superconducting thin films on flex ribbon substrates can also provide effective filtering of high frequency (e.g. >25 GHz) noise.

(7) Microwave combiners/splitters/multiplexers: Microwave structures, including quadrature hybrids and rat race couplers, can accomplish microwave combining, splitting, and multiplexing on a flex ribbon. Specifically, multiple signals within the interface can be combined pairwise with substrate-integrated microwave hybrids, resistive dividers, or Wilkinson dividers.

(8) Microwave attenuators: Using lossy materials, distributed resistive attenuators can provide attenuation with limited heating on a flex ribbon. Planar capacitive structures, when placed inline with signal transport structures, can realize reflective attenuators within a flex interface.

(9) Heat sinking: Thermal planes integrated within a flex ribbon, combined with defined thermal mounting points, accomplish controlled and predictable heat sinking across a flex ribbon. In traversing between room temperature equipment and cryogenic quantum hardware, the interface crosses several thermal boundaries between successive refrigeration stages. The interface must have strong thermal contact at each boundary to absorb heat flow from higher temperatures and to absorb any power dissipation from transport and conditioning of signals. Inclusion of high thermal conductivity metal planes (e.g. copper) secured to refrigeration stages creates a high quality thermal interface with excellent predictability. The temperature profile of every signal and microwave element within the interface can be accurately prescribed a priori at design time.

(10) Qubit launchers: One or more signal transport structures extending along a narrow flex ribbon terminate in an antenna structure. This thin ribbon is inserted and secured within a microwave cavity in which single photons encode quantum information. The interaction between antenna and cavity creates a qubit launcher, coupling between flex-transported signals and cryogenic quantum hardware. A single flex ribbon containing multiple transport structures can fan out into individual qubit launchers that are installed in cavities distributed across quantum hardware.

An Exemplary Embodiment of the Integrated Flex Interface

A quantum module is a discrete unit of cryogenic computational hardware. Capability and performance of a quantum computer is related to the number of quantum modules and their interconnections. In one embodiment, an integrated flex interface enables operation of a single quantum module from room temperature electronics.

Figure 4:
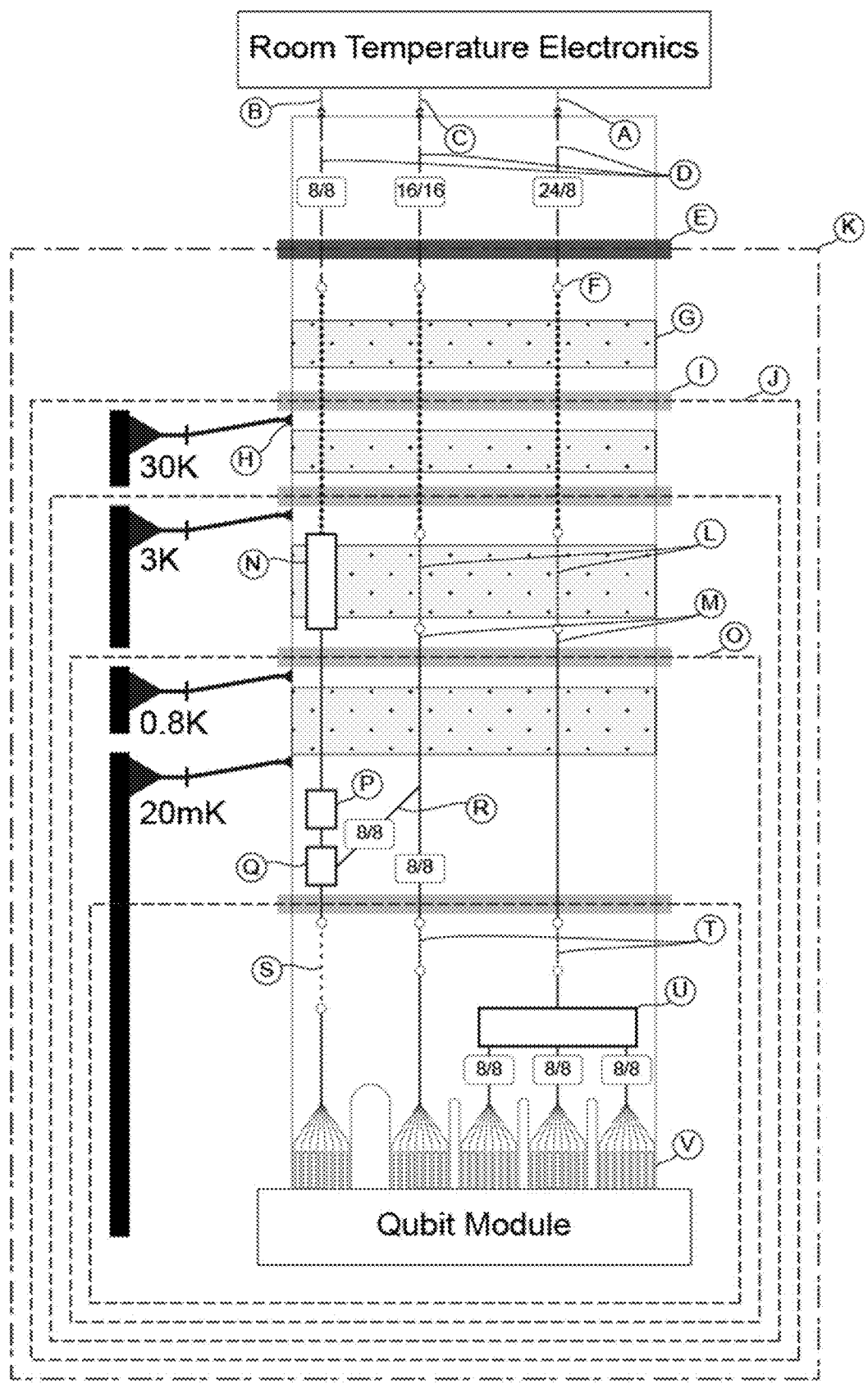
FIG. 4 shows a detailed diagram of an integrated flex interface used to operate a single qubit module from room temperature electronics in accordance with an embodiment of the present invention.

FIG. 4 shows a detailed diagram of an integrated flex interface used to operate a single qubit module from room temperature electronics in accordance with an embodiment of the present invention. Room temperature electronics supply 32 control signals and 8 pump signals, and receive 8 output signals from the integrated flex interface. Spectral multiplexing allows the 24 of the control signals to share 8 coaxial cables, each transporting 3 signals (A in FIG. 4). Coaxial cables transport the 8 output signals (B in FIG. 4), the 8 pump signals (C in FIG. 4), and the remaining 8 control signals (C in FIG. 4) individually. The result is 32 coaxial cables carrying 48 signals at room temperature, transitioning to the integrated flex interface using an array of 32 surface-mount SMP connectors.

The SMP connectors launch into 32 copper striplines (D in FIG. 4) within the integrated flex interface, 8 of which carry individual output signals while 32 striplines transport the 40 control and pump signals. A ribbon of these copper striplines transports all 48 signals through a K-F flange vacuum feedthrough at room temperature (E in FIG. 4) to enter evacuated volume (K in FIG. 4). All copper striplines transition (F in FIG. 4) to brass stripline for thermally insulated signal transport across the temperature gradient (G in FIG. 4) from room temperature to the 30K refrigeration stage. The flex ribbon is thermally anchored (H in FIG. 4) to the 30K stage and uses a shielded feedthrough (I in FIG. 4) to penetrate into a light-sealed volume (J in FIG. 4). Brass striplines continue across a thermal gradient to the 3K refrigeration stage, where they are again thermally anchored and use a shielded feedthrough to penetrate a second light-sealed volume.

Emerging into the second light-sealed volume are 24 brass striplines carrying 40 control and pump signals and 8 brass striplines carrying 8 output signals. The 24 brass control and pump striplines transition to copper-nickel for distributed attenuation (L in FIG. 4) while traversing a thermal gradient to the 0.8K refrigeration stage, where the flex interface is thermally anchored. After thermal anchoring at 0.8K, the 24 copper-nickel striplines transition to 24 aluminum control striplines (M in FIG. 4).

The 8 brass output striplines connect to the 8 amplifier outputs of an 8 channel packaged surface-mount HEMT (N in FIG. 4). The input side of the HEMT incorporates NbTi lines that superconduct while traversing the thermal gradient to 0.8K. The 8 inputs of the 8 channel HEMT are surface-mounted to 8 aluminum output striplines in the flex interface positioned after the thermal gradient at a flex region thermally anchored to 0.8K.

The 32 aluminum striplines at 0.8K (8 output, 16 control, 8 pump) use a shielded feedthrough to penetrate a third light-sealed volume (Q in FIG. 4). The 32 aluminum striplines provide thermally insulated signal transport across a thermal gradient to the 20 mK refrigeration stage, where they are thermally anchored.

Each of the 8 aluminum striplines transporting output signals through 2 inline isolators (P in FIG. 4) and a parametric amplifier (Q in FIG. 4), all surface mount microwave components operating at 20 mK but outside the final light shield. The 8 pump striplines terminate at the 8 parametric amplifiers (R in FIG. 4). The 24 remaining aluminum striplines (8 output, 16 control) then use a shielded feedthrough to penetrate the final light-sealed volume, the "dark volume" containing cryogenic quantum hardware.

Spectral filtering. The 8 output aluminum striplines transition to thin film Ti striplines (S in FIG. 4) for spectral filtering, then back to aluminum. Because coherence in quantum information systems can be destroyed by unwanted high frequency interference, we designed, fabricated, and tested a novel transmission line low pass filter for use as item S of FIG. 4, based on the normal and superconductive properties of titanium microstrip transmission lines. Unlike a conventional reflective microwave low pass filter with reentrant modes, our filter is expected to unconditionally attenuate power at frequencies far above its passband, such as above 300 GHz. Above the superconducting gap frequency, the superconductor Titanium is highly dissipative, behaving much like a normal metal, whereas, below the gap, it transmits signals without significant dissipation.

Testing of spectral filtering. We carried out a test to demonstrate the expected difference in the transmission in the normal and superconducting states, which is a good proxy for the performance below and above the superconducting gap frequency. We fabricated a microstrip transmission line with a copper ground plane and a vapor-deposited titanium top conductor. We cooled this system to 0.020 K, measuring its transmission as a function of temperature. As a reference, we used transmission lines from room temperature of the same design with a copper section in place of the Ti flex line. We saw a sharp increase in transmission below 0.35 K, indicating its superconducting transition. This transition temperature (Tc) corresponds to a superconducting gap frequency of ~28 GHz; we expect the transmission line to have very low loss at frequencies below the gap, but behave as a normal resistive metal above the gap. We expect this normal state loss (above Tc) to be independent of frequency until the magnetic penetration depth is equal to the thickness of the top conductor. Above this frequency, we expect the transmission as the square root of frequency, so assuming low frequency loss serves as a lower limit for high frequency loss, the true high frequency loss with be equal or higher than this. Above the superconducting gap frequency, we expect the loss to be similar above and below Tc. Thus, the normal state low frequency loss is a proxy estimate for the high frequency loss.

We can measure the line characteristics in the superconducting and normal states by testing with the sample above and below Tc. The ratio of the transmission in the normal and superconducting states provides a lower limit for the expected attenuation above the superconducting gap frequency when cooled below Tc. We tested the Ti and Cu flex lines at their operating temperature of 20 mK. The transmission of the Ti flex line was compared to the Cu reference line as a function of frequency when cooled far below the Tc of the Ti. The ratio of these measurement provides an estimate of the loss of the Ti line compared to the Cu line, with about 2 dB of additional loss in the Ti line. This can be further reduced by using a superconducting ground plane.

Ti flex line filter performance. We compared the transmission of the Ti line in the normal and superconducting state. With the Ti in the normal state, the loss is much higher than the reference line, with the loss increasing with frequency, reaching approximately 40 dB of loss at 8 GHz. At frequencies above the superconducting gap frequency (28 GHz for Ti) this should be a lower limit to the loss of the Ti even in the superconducting state. Thus the filter provides excellent rejection (>40 dB) of high frequency interference while providing low loss (<2 dB) in the 0-10 GHz region. This in-band loss can be further reduced by using a superconducting ground plane. This Ti flex line is a high transmission low pass transmission line filter, and it can offer significant advantages in eliminating interference from high frequency signals in quantum information experiments compared to the state of the art.

Other aspects of integrated flex interface. The 16 control striplines transition to copper-nickel striplines (T in FIG. 4) for attenuation, then back to aluminum. Engineered aluminum stripline-based structures (U in FIG. 4) demultiplex and filter the 16 control signals onto 32 aluminum striplines, each containing a single control signal. The 40 control and output signals from room temperature now appear on 40 individual aluminum striplines on the flex interface ribbon.

These 40 striplines break out into 40 individual flex ribbons in a wire-harness topology. Individual ribbons terminate in flex qubit launchers (V in FIG. 4) that are individually mounted to appropriate cavities in the cryogenic quantum module, completing the integrated flex interface, Features of the Flex Solution An integrated flex interface effectively resolves the key challenges that plague conventional interfaces identified above. The tightly integrated and capable platform improves the 1) scalability over capability, volume, cost, and install time, 2) reliability, 3) RF performance, 4) qubit lifetimes and 5) thermal performance of interfaces to cryogenic quantum systems, allowing these systems access to higher computational performance and capability.

1) Excellent Scalability. The tight integration achievable by a flex platform enables interfaces to cryogenic hardware to scale easily to large signal and qubit counts with expansive microwave networks. In contrast with conventional coax cable, flex signal lines are very flexible and can be tightly packed. Many microwave components can be integrated onto the substrate, reducing their volume while eliminating connectors and the need for assembly. Extended integrated flex ribbons can easily traverse multiple magnetic shields and light seals, enabling transport of 50 or more signals through these sealing structures with compact and minimal hardware. These features lead to integrated flex interfaces scaling far more effectively to support increasingly complex and capable cryogenic quantum systems, in comparison with the conventional approach.

2) High Reliability. An integrated flex approach dramatically reduces component count in comparison to a conventionally implemented interface. Flex ribbons can traverse light and magnetic sealing bulkheads without connectors and with minimal supporting hardware. Each microwave component integrated onto the substrate, whether by native implementation within the layup or population of components and modules onto the flex surface, eliminates cables, connectors, and assembly operations. By integrating the majority of microwave elements onto or within the flex structure, a flex interface reduces component count by orders of magnitude and increases system reliability by a similar factor on a per-signal basis. This increase in reliability per signal in the interface is critical to scaling complexity and capability of cryogenic quantum systems. Reduction of component count also radically reduces the work required to cable a dilution refrigerator for quantum computing applications.

3) Improved RF performance. Flex interfaces can achieve higher RF performance than conventionally implemented quantum interfaces. Bespoke microwave components designed on-substrate often outperform conventional "black box" components, for example by reducing temperature rise during operation leading to higher signal to noise ratios. A thin flex ribbon allows integrated microwave components to simultaneously have a large footprint but small volume, allowing effective control of self-heating while still scaling to large signal counts. The small physical scale of the flex transmission lines and integrated microwave structures also allows far more effective suppression of 100 GHz photons, an RF performance problem that plagues conventional coaxial cables. In particular, this feature is critical for Aluminum qubits within which 100 GHz photons can break Cooper pairs. An integrated flex interface also eliminates many connectors from the system, a primary source of loss for conventional "low-loss" design elements. This increase in RF performance enabled by an integrated flex interface in turn enables higher performance cryogenic quantum systems.

4) Improved Qubit Lifetimes. A flex interface more effectively controls thermal photons than does a conventional approach, leading to reduced noise and improved qubit lifetimes. Integrating tens or hundreds of signals onto a single ribbon enables fewer and less leaky traversals through light sealing interfaces. By allowing fewer thermal photons to infiltrate the innermost volumes that house cryogenic quantum hardware, integrated an integrated flex interface increases achievable quantum state lifetimes and thereby increases computational capability.

5) Excellent Thermal Predictability. An integrated flex interface includes tightly coupled and predictable thermal circuitry. Thermal conduction layers incorporated with the flex ribbon transport heat from integrated microwave components and transport circuitry to heat sinking interfaces. A thin integrated ribbon format leads to dramatically decreased overall heat capacity of the interface. Large area thermal contact between conduction layers and integrated microwave components mitigates signal-dependence of temperature, and deliberate, engineered thermal interfaces between the integrated flex interface and thermal sinks of refrigeration hardware enables tight predictability of the interface temperature and integrated component temperature during operation. The ability to implement an interface with stable and predictable temperatures enables more accurate realization of control signal and total photon spectrum reaching each cryogenic quantum element. This accurate realization leads to higher performance operation of quantum hardware.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. An interface between cryogenic computational hardware and room temperature computational hardware, the interface comprising:
a plurality of discrete stages, including a first stage at room temperature and a last stage at a cryogenic temperature, each successive stage being configured for operation at a corresponding refrigeration temperature that is lower than the refrigeration temperature of each preceding stage and including a set of planar transmission lines, the transmission lines of any given stage other than the first stage being proximally coupled to and contiguous with the transmission lines of an immediately preceding stage, the transmission lines of the first stage being proximally coupled to the room temperature computational hardware and the transmission lines of the last stage being proximally coupled to the cryogenic computational hardware, each stage having shielding configured to block electromagnetic radiation external to such stage;

wherein the transmission lines of any stage other than the first stage are implemented as a stripline passing through a feedthrough aperture in a cap and barrier interface, the feedthrough aperture in the cap and barrier interface being defined by a clamping face of a cap and a surface of a barrier, wherein the cap is configured to squeeze the stripline against the barrier and shaped so as to provide a light seal preventing transmission of radiation between adjacent stages along the cap and barrier interface and the stripline.

2. An interface according to claim 1, wherein stages after the first stage are evacuated.

3. An interface according to claim 2, wherein the transmission lines of any stage other than the first stage are disposed in a polymeric block defining a feedthrough region between stages so as to maintain evacuation of the stages.

4. An interface according to claim 1, wherein the transmission lines of any stage other than the first stage are shielded from electromagnetic radiation.

5. An interface according to claim 1, wherein a set of the transmission lines at the last stage is configured as thin Ti microstrips, in each case deposited on a copper ground plane, and operating in a milli K temperature range, so as to provide low pass transmission line filtering.

6. An interface according to claim 1, wherein the transmission lines between at least one pair of adjacent stages are made of a material selected from the group consisting of stainless steel, copper-nickel alloys, nickel-chromium, brass, and combinations thereof.

7. An interface according to claim 1, wherein the transmission lines between at least one pair of adjacent stages are made of a superconducting material, selected from the group consisting of aluminum, zinc, titanium, and combinations thereof, configured to provide ultra low loss signal transport capability at temperatures below a critical temperature of the superconducting material.

8. An interface according to claim 1, wherein the transmission lines between at least one pair of adjacent stages are configured to provide desired filtering of a type selected between band-pass and low-pass.

9. An interface according to claim 1, wherein the transmission lines between at least one pair of adjacent stages are configured to implement a microwave process selected from the group consisting of combining, splitting, multiplexing, and combinations thereof.

10. An interface according to claim 1, wherein the transmission lines between at least one pair of adjacent stages are configured to provide desired microwave attenuation.

11. An interface according to claim 1, wherein the transmission lines between at least one pair of adjacent stages are configured to provide desired thermal conductivity.

12. An interface according to claim 1, wherein the transmission lines from a last stage terminate in an antenna structure configured as a qubit launcher.

\* \* \* \* \*